United States Patent
Kuo et al.

(10) Patent No.: US 7,434,080 B1
(45) Date of Patent: Oct. 7, 2008

(54) APPARATUS FOR INTERFACING AND TESTING A PHASE LOCKED LOOP IN A FIELD PROGRAMMABLE GATE ARRAY

(75) Inventors: Wei-Min Kuo, San Jose, CA (US); Donald Y. Yu, Fremont, CA (US)

(73) Assignee: Actel Corporation, Mountain View, CA (US)

( * ) Notice: Subject to any disclaimer, the term of this patent is extended or adjusted under 35 U.S.C. 154(b) by 136 days.

(21) Appl. No.: 10/235,245

(22) Filed: Sep. 3, 2002

(51) Int. Cl.
*G06F 1/04* (2006.01)

(52) U.S. Cl. .................. 713/500; 713/400; 713/600

(58) Field of Classification Search ............... 713/400, 713/500, 501, 600
See application file for complete search history.

(56) References Cited

U.S. PATENT DOCUMENTS

| | | | |
|---|---|---|---|
| 4,255,748 A | 3/1981 | Bartlett | 340/661 |
| 4,625,313 A | 11/1986 | Springer | 371/20 |
| 4,638,187 A | 1/1987 | Boler et al. | 307/451 |
| 4,638,243 A | 1/1987 | Chan | 324/51 |
| 4,684,830 A | 8/1987 | Tsui et al. | 307/465 |
| 4,700,130 A | 10/1987 | Bloemen | 324/110 |
| 4,706,216 A | 11/1987 | Carter | 365/94 |
| 4,713,557 A | 12/1987 | Carter | 307/242 |
| 4,717,912 A | 1/1988 | Harvey et al. | 340/825.83 |
| 4,718,042 A | 1/1988 | Moll et al. | 365/201 |
| 4,742,252 A | 5/1988 | Agrawal | 307/465 |
| 4,772,812 A | 9/1988 | Desmarais | 307/473 |
| 4,800,176 A | 1/1989 | Kakumu et al. | 437/193 |
| 4,857,774 A | 8/1989 | El-Ayat et al. | 307/465 |
| 4,870,300 A | 9/1989 | Nakaya et al. | 307/303 |
| 4,870,302 A | 9/1989 | Freeman | 307/465 |
| 4,873,459 A | 10/1989 | El Gamal et al. | 307/465 |
| 4,928,023 A | 5/1990 | Marshall | 307/443 |
| 4,930,097 A | 5/1990 | Ledenbach et al. | 364/716 |
| 4,935,645 A | 6/1990 | Lee | 307/362 |
| 4,959,561 A | 9/1990 | McDermott et al. | 307/443 |
| 4,978,905 A | 12/1990 | Hoff et al. | 323/314 |
| 5,008,855 A | 4/1991 | Eltoukhy et al. | 365/96 |
| 5,046,035 A | 9/1991 | Jigour et al. | 364/716 |
| 5,083,083 A | 1/1992 | El-Ayat et al. | 324/158 R |

(Continued)

FOREIGN PATENT DOCUMENTS

EP   0 415 542 A2   3/1991

(Continued)

OTHER PUBLICATIONS

L. Ashby, "ASIC Clock Distribution Using A Phase Locked Loop (PLL)", pp. P1-6.1-P1-6.3, 1991, no month.

(Continued)

*Primary Examiner*—Dennis M Butler
(74) *Attorney, Agent, or Firm*—Lewis and Roca LLP

(57) ABSTRACT

An apparatus for interfacing a phase locked loop in a field programmable gate array. The apparatus comprising a phase locked loop cluster. The phase locked loop further comprising a plurality of RT modules, a plurality of RO modules, at least one TY module, a plurality of receiver modules and at least one buffer module. A phase locked loop selectively coupled to the RT modules, the RO modules, the TY modules, the receiver modules and at least one buffer module in the phase locked loop cluster.

11 Claims, 8 Drawing Sheets

U.S. PATENT DOCUMENTS

| | | | |
|---|---|---|---|
| 5,121,394 A | 6/1992 | Russell | 371/22.1 |
| 5,122,685 A | 6/1992 | Chan et al. | 307/465.1 |
| 5,126,282 A | 6/1992 | Chiang et al. | 437/172 |
| 5,132,571 A | 7/1992 | McCollum et al. | 307/465.1 |
| 5,144,166 A | 9/1992 | Camarota et al. | 307/465.1 |
| 5,187,392 A | 2/1993 | Allen | 307/465 |
| 5,198,705 A | 3/1993 | Galbraith et al. | 307/465 |
| 5,208,491 A | 5/1993 | Ebeling et al. | 307/465 |
| 5,220,213 A | 6/1993 | Chan et al. | 307/465 |
| 5,220,215 A | 6/1993 | Douglas et al. | 307/465 |
| 5,221,865 A | 6/1993 | Phillips et al. | 307/465 |
| 5,222,066 A | 6/1993 | Grula et al. | 371/21.1 |
| 5,258,319 A | 11/1993 | Inuishi et al. | 437/35 |
| 5,272,388 A | 12/1993 | Bakker | 307/202.1 |
| 5,286,922 A | 2/1994 | Curtiss | 174/112 |
| 5,293,133 A | 3/1994 | Birkner et al. | 324/713 |
| 5,300,830 A | 4/1994 | Hawes | 307/465 |
| 5,300,832 A | 4/1994 | Rogers | 307/475 |
| 5,317,698 A | 5/1994 | Chan | 395/325 |
| 5,365,485 A | 11/1994 | Ward et al. | 365/221 |
| 5,367,207 A | 11/1994 | Goetting et al. | 307/465 |
| 5,375,089 A | 12/1994 | Lo | 365/189.04 |
| 5,394,033 A | 2/1995 | Tsui et al. | 326/41 |
| 5,394,034 A | 2/1995 | Becker et al. | 326/39 |
| 5,396,128 A | 3/1995 | Dunning et al. | 326/68 |
| 5,397,939 A | 3/1995 | Gordon et al. | 326/38 |
| 5,399,920 A | 3/1995 | Van Tran | 326/83 |
| 5,400,262 A | 3/1995 | Mohsen | 364/489 |
| 5,430,335 A | 7/1995 | Tanoi | 327/170 |
| 5,430,687 A | 7/1995 | Hung et al. | 365/230.08 |
| 5,469,003 A | 11/1995 | Kean | 326/39 |
| 5,469,396 A | 11/1995 | Eltoukhy | 365/210 |
| 5,473,268 A | 12/1995 | Declercq et al. | 326/80 |
| 5,485,103 A | 1/1996 | Pedersen et al. | 326/41 |
| 5,486,775 A | 1/1996 | Veenstra | 126/38 |
| 5,526,312 A | 6/1996 | Eltoukhy | 365/201 |
| 5,537,057 A | 7/1996 | Leong et al. | 326/41 |
| 5,546,019 A | 8/1996 | Liao | 326/81 |
| 5,559,464 A | 9/1996 | Orii et al. | 327/333 |
| 5,572,476 A | 11/1996 | Eltoukhy | 365/210 |
| 5,666,322 A | 9/1997 | Conkle | 365/233 |
| 5,670,905 A | 9/1997 | Keeth et al. | 327/333 |
| 5,744,979 A | 4/1998 | Goetting | 326/39 |
| 5,744,980 A | 4/1998 | McGowan et al. | 326/40 |
| 5,801,547 A | 9/1998 | Kean | 326/40 |
| 5,809,281 A | 9/1998 | Steele et al. | 395/497.01 |
| 5,815,003 A | 9/1998 | Pedersen | 326/39 |
| 5,815,004 A | 9/1998 | Trimberger et al. | 326/41 |
| 5,821,776 A | 10/1998 | McGowan | 326/41 |
| 5,825,200 A | 10/1998 | Kolze | 326/38 |
| 5,825,201 A | 10/1998 | Kolze | 326/39 |
| 5,825,202 A | 10/1998 | Tavana et al. | 326/39 |
| 5,825,662 A | 10/1998 | Trimberger | 364/491 |
| 5,828,230 A | 10/1998 | Young | 326/41 |
| 5,828,538 A | 10/1998 | Apland et al. | 361/56 |
| 5,831,448 A | 11/1998 | Kean | 326/41 |
| 5,832,892 A | 11/1998 | Yaoita | 123/260 |
| 5,835,165 A | 11/1998 | Keate et al. | 348/845.1 |
| 5,835,998 A | 11/1998 | Pedersen | 326/40 |
| 5,838,167 A | 11/1998 | Erickson et al. | 326/38 |
| 5,838,584 A | 11/1998 | Kazarian | 364/491 |
| 5,838,954 A | 11/1998 | Trimberger | 395/500 |
| 5,847,441 A | 12/1998 | Cutter et al. | 257/530 |
| 5,847,577 A | 12/1998 | Trimberger | 326/38 |
| 5,848,005 A | 12/1998 | Cliff et al. | 365/230.03 |
| 5,848,006 A | 12/1998 | Nagata | 365/230.06 |
| 5,850,151 A | 12/1998 | Cliff et al. | 326/39 |
| 5,850,152 A | 12/1998 | Cliff et al. | 326/40 |
| 5,850,564 A | 12/1998 | Ting et al. | 395/800.37 |
| 5,852,608 A | 12/1998 | Csoppenszky et al. | 370/465 |
| 5,854,763 A | 12/1998 | Gillingham et al. | 365/189.04 |
| 5,859,542 A | 1/1999 | Pedersen | 326/39 |
| 5,859,543 A | 1/1999 | Kolze | 326/41 |
| 5,859,544 A | 1/1999 | Norman | 326/40 |
| 5,861,761 A | 1/1999 | Kean | 326/41 |
| 5,869,981 A | 2/1999 | Agrawal et al. | 326/39 |
| 5,870,586 A | 2/1999 | Baxter | 395/500 |
| 5,880,492 A | 3/1999 | Duong et al. | 257/209 |
| 5,880,512 A | 3/1999 | Gordon et al. | 257/530 |
| 5,880,597 A | 3/1999 | Lee | 326/41 |
| 5,880,598 A | 3/1999 | Duong | 326/41 |
| 5,883,526 A | 3/1999 | Reddy et al. | 326/41 |
| 5,883,850 A | 3/1999 | Lee et al. | 365/230.03 |
| 5,949,719 A | 9/1999 | Clinton et al. | 365/189.01 |
| 5,952,847 A | 9/1999 | Plants et al. | 326/80 |
| 5,994,934 A | 11/1999 | Yoshimura et al. | 327/158 |
| 6,011,744 A | 1/2000 | Sample et al. | 365/230.03 |
| 6,034,677 A | 3/2000 | Noguchi et al. | 345/327 |
| 6,038,627 A | 3/2000 | Plants | 710/126 |
| 6,049,487 A | 4/2000 | Plants et al. | 365/189.04 |
| 6,111,448 A | 8/2000 | Shibayama | 327/293 |
| 6,181,174 B1 | 1/2001 | Fujieda et al. | 327/158 |
| 6,272,646 B1 * | 8/2001 | Rangasayee et al. | 713/500 |
| 6,289,068 B1 | 9/2001 | Hassoun et al. | 375/376 |
| 6,292,016 B1 | 9/2001 | Jefferson et al. | 326/39 |
| 6,329,839 B1 | 12/2001 | Pani et al. | 326/41 |
| 6,426,649 B1 * | 7/2002 | Fu et al. | 326/41 |
| 6,430,088 B1 | 8/2002 | Plants et al. | 365/189.04 |
| 6,437,650 B1 | 8/2002 | Sung et al. | 331/25 |
| 6,496,887 B1 | 12/2002 | Plants | 710/100 |
| 6,604,231 B2 * | 8/2003 | Kaneko | 716/16 |
| 6,690,224 B1 * | 2/2004 | Moore | 327/296 |
| 6,856,171 B1 * | 2/2005 | Zhang | 326/93 |

FOREIGN PATENT DOCUMENTS

| | | |
|---|---|---|
| EP | 0 415 542 A3 | 10/1991 |
| EP | 0 889 593 A1 | 1/1999 |
| EP | 1 137 188 A2 | 9/2001 |

OTHER PUBLICATIONS

AV9170 Application Note: Clock Synchronizer and Multiplier, AvaSem Corp., pp. 1-4, 8, Nov. 1992.

AV9170 Application Note: Preliminary Information, AvaSem Corp., p. 1-7, Jan. 1993.

A. Efendovich, "Multi-Frequency Zero-Jitter Delay-Locked Loop", *IEEE 1993 Custom Integrated Circuits Conference*, pp. 27.1.1-27.1.4, May 1993.

U. Ko, "A 30-ps Jitter, 3.6-µs Locking, 3.3-Volt Digital PLL for CMOS Gate Arrays", *IEEE 1993 Custom Integrated Circuits Conference*, pp. 23.3.1-23.3.4, May 1993.

R. Quinnell, "Blending gate arrays with dedicated circuits sweetens ASIC development", *EDN*, pp. 29-32, Mar. 31, 1994.

J. Chen, "PLL-based clock systems span the system spectrum from green PCs to Alpha", *EDN*, pp. 147-148, 150, 152, 154155, Nov. 9, 1995.

P. Sevalia, "Straightforward techniques cut jitter in PLL-based clock drivers", *EDN*, pp. 119-123, Nov. 23, 1995.

D. Bursky, "Memories Hit New Highs And Clocks Run Jitter-Free", *Electronic Design*, pp. 79-80, 84-85, 89-90, 92-93, Feb. 19, 1996.

S. Sharpe, PLL Design Techniques and Usage in FPGA Design, Xilinx Application Brief SBRF 006 (Version 1.1), pp. 1-4, Aug. 28, 1996.

"Advantages of APEX PLLs Over Virtex DLLs", Technical Brief 60 version 1, Altera Corp., pp. 1-4, Nov. 1999.

"Using APEX 20K & APEX 20KE PLLs in the Quartus Software", Altera White Paper Version 1.0, pp. 1-20, Jan. 2000.

"Eclipse: Combining Performance, Density, and Embedded RAM", Eclipse Family Data Sheet, pp. 5-1 to 5-12., Updated Aug. 24, 2000.

"Using the Virtex Delay-Locked Loop", Application Note: Virtex Series XAPP132 (v.2.3), Xilinx Corp., pp. 1-15, Sep. 20, 2000.

"Virtex-II Digital Clock Manager", Virtex Tech Topic VTT010 (V1. 0), pp. 1-9, Feb. 1, 2001.

"APEX Phase-Locked Loop Circuitry", [Internet] http://www.altera.com/products/devices/apex/apx-pll.html, pp. 1-3, printed Aug. 15, 2001.

US 6,564,273, 05/2003, Plants (withdrawn)

* cited by examiner

APPARATUS FOR INTERFACING AND TESTING A PHASE LOCKED LOOP IN A FIELD PROGRAMMABLE GATE ARRAY

BACKGROUND OF THE SYSTEM

1. Field of the System

The present system relates to field programmable gate array (FPGA) devices. More specifically, the system relates to an apparatus for interfacing and testing a phase locked loop of an FPGA.

2. Background

FPGAs are known in the art. An FPGA comprises any number of logic modules, an interconnect routing architecture and programmable elements that may be programmed to selectively interconnect the logic modules to one another and to define the functions of the logic modules. To implement a particular circuit function, the circuit is mapped into an array and appropriate connections are programmed to implement the necessary wiring connections that form the user circuit.

A gate array circuit can be programmed to implement virtually any set of functions. Input signals are processed by the programmed circuit to produce the desired set of outputs. Such inputs flow from the user's system, through input buffers and through the circuit, and finally back out the user's system via output buffers. Such buffers provide any or all of the following input/output (I/O) functions: voltage gain, current gain, level translation, delay, signal isolation or hysteresis.

An FPGA core tile may be employed as a stand-alone FPGA, repeated in a rectangular array of core tiles within a single integrated circuit, or included with other devices in a system-on-a-chip (SOC). The core FPGA tile may include an array of logic modules, and input/output modules. An FPGA core tile may also include other components such as read only memory (RAM) modules. Horizontal and vertical routing channels provide interconnections between the various components within an FPGA core tile. Programmable connections are provided by programmable elements coupled between the routing resources.

As FPGAs grow in size, on-chip clock distribution becomes increasingly important. Clock skew and clock delay impact FPGA performance and the task of managing clock skew and clock delay with conventional clock trees becomes more difficult in large FPGAs. As such, in large, fast FPGAs, the performance limiting element is often clock delay due to large clock networks. Phase locked loops (PLLs) are used to reduce the clock delays inherent in large FPGAs and, thereby improve performance.

FIG. 1 is a simplified diagram illustrating two internal clock tree branches. This is known to those skilled in the art as an "H tree" clock distribution scheme. The goal of a PLL is to minimize clock skew by having near equal delay in each branch of the clock network. As the FPGA grows, the number of branches is increased, and buffer sizes are tuned to equalize the delay between branches.

FIG. 2 shows the relationship between total clock delay and skew, or the difference in delay between the branches in the clock tree. Both total clock delay and clock skew are factors in high performance systems.

By anticipating the edges of the input clock, a PLL can generate new clocks with edges slightly earlier than the input clock. By tuning the amount of time these new clock edges precede the input clock edge to the delays of the various clock tree branches, all registers will see the clock edge at about the same time. This reduces the overall clock network delay as well as minimizing clock skew.

FIG. 3 is a simplified diagram illustrating the timing of a clock network using a PLL. As shown in FIG. 3, the internal clock (dotted lines) are being generated ahead of the input clock, so the internal clocks arrive at their destinations much closer to the input clock edge. Some clock skew still occurs due to the delay in each branch, however overall performance is improved by using a PLL.

Hence, PLLs are important tools to increase performance in large, fast FPGAs. There is need in the art for an apparatus for interfacing and testing PLLs in an FPGA.

SUMMARY OF THE SYSTEM

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE DRAWINGS

Those of ordinary skill in the art will realize that the following description of the present invention is illustrative only and not in any way limiting. Other embodiments of the invention will readily suggest themselves to such skilled persons.

This disclosure may relate to data communications. Various disclosed aspects may be embodied in various computer and machine-readable data structures. Furthermore, it is contemplated that data structures embodying the teachings of the disclosure may be transmitted across computer and machine-readable media, and through communications systems by use of standard protocols such as those used to enable the Internet and other computer networking standards.

The disclosure may relate to machine-readable media on which are stored various aspects of the disclosure. It is contemplated that any media suitable for retrieving instructions is within the scope of the present disclosure. By way of example, such media may take the form of magnetic, optical, or semiconductor media, and may be configured to be accessible by a machine as is known in the art.

Various aspects of the disclosure may be described through the use of flowcharts. Often, a single instance of an aspect of the present disclosure may be shown. As is appreciated by those of ordinary skill in the art, however, the protocols, processes, and procedures described herein may be repeated continuously or as often as necessary to satisfy the needs described herein. Accordingly, the representation of various aspects of the present disclosure through the use of flowcharts should not be used to limit the scope of the present disclosure.

Figure 1:
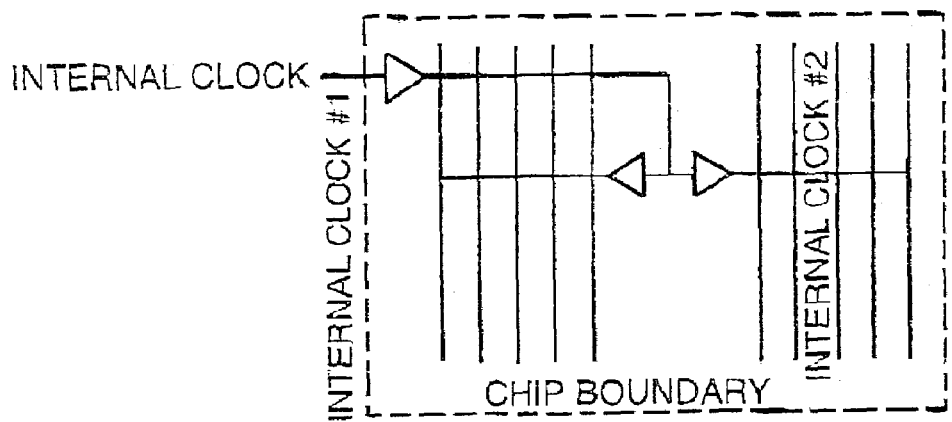
FIG. 1 is a simplified diagram illustrating two internal clock tree branches.
Figure 2:
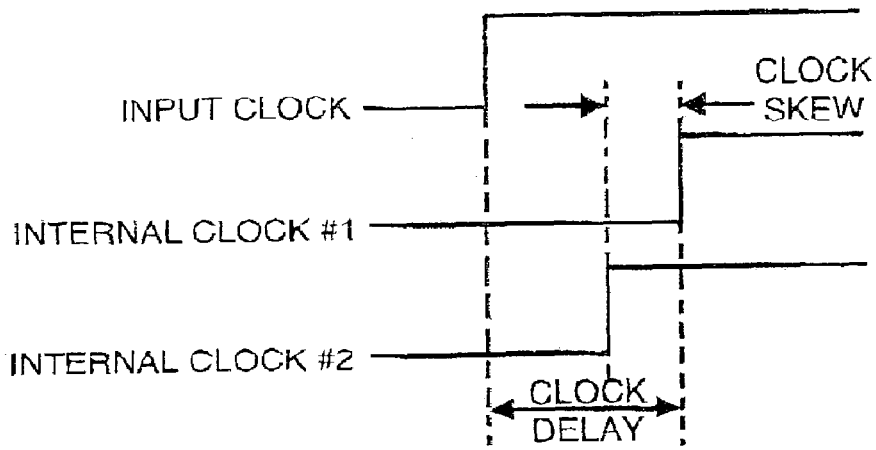
FIG. 2 is a simplified diagram showing the relationship between total clock delay and clock skew.
Figure 3:
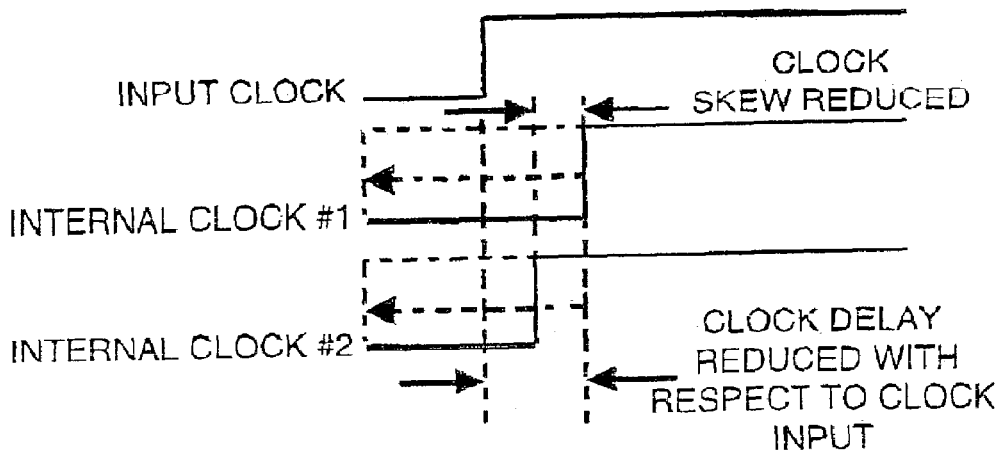
FIG. 3 is a simplified diagram illustrating the timing of a clock network using a PLL.
Figure 4:
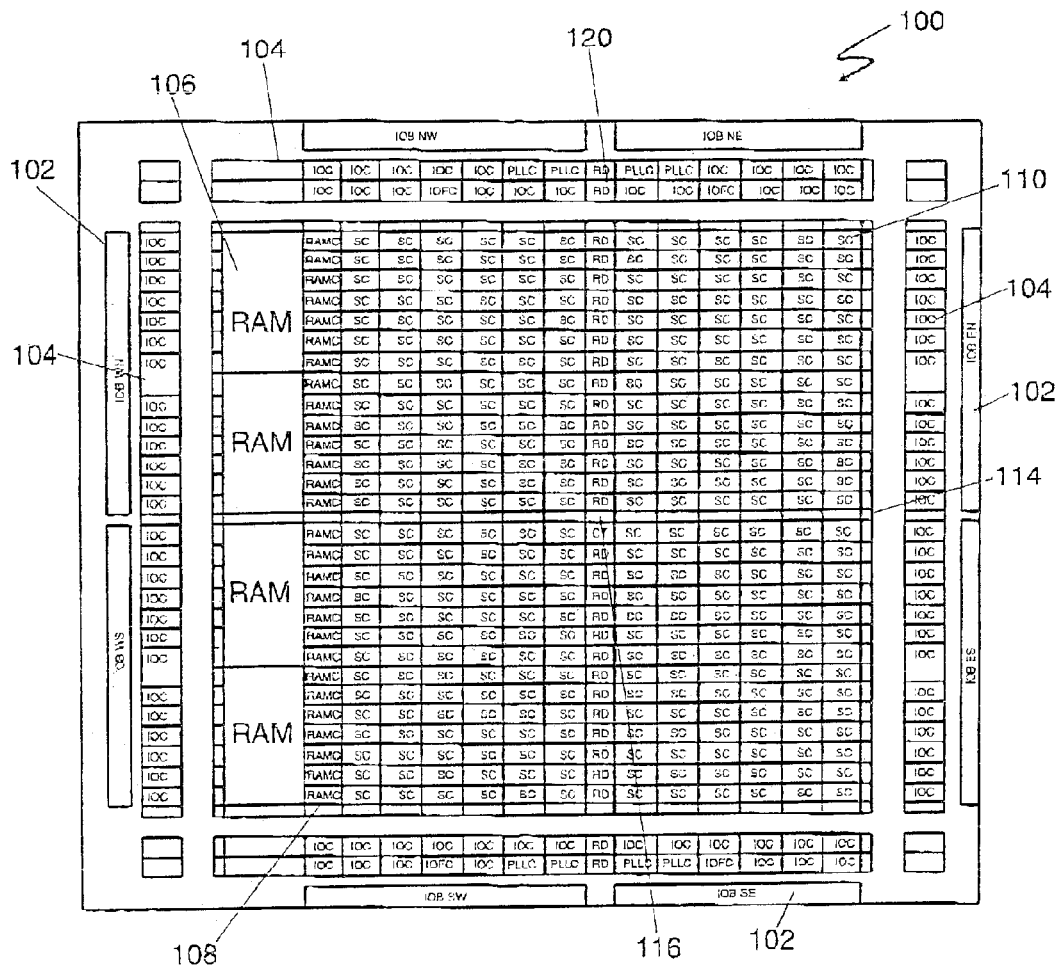
FIG. 4 is a simplified block diagram of an FPGA core tile incorporating the PLL clusters of the present system.

FIG. 4 is a simplified block diagram of an FPGA 100 incorporating the PLL interface, described in this application as a PLL cluster, as disclosed in the present system. As shown in FIG. 4, FPGA 100 comprises an array of logic clusters 110, a column of RCLK Row Dist 112, a row of HCLK Row Dist 114, a Clock tile Dist 116, a row of RAM clusters 108, RAM memory 106. Logic clusters 110 are surrounded by two rows of input/output (I/O) clusters 104 and I/O banks 102. On the north and south edges of FPGA core tile 100 there are eight phase locked loop clusters (PLL clusters) 120. Four PLL clusters 120 are located on the north edge of FPGA core tile 100 and four PPL clusters 120 are located on the southern edge of FPGA core tile 100. The eight PLL clusters 120 located on the northern and southern edges of FPGA core tile 100 displace eight I/O clusters 104. PLL clusters 120 are coupled to two I/O pads located in I/O banks 102. The interface between PLL clusters 120 and I/O banks 102 will be discussed in greater detail below.

Figure 5:
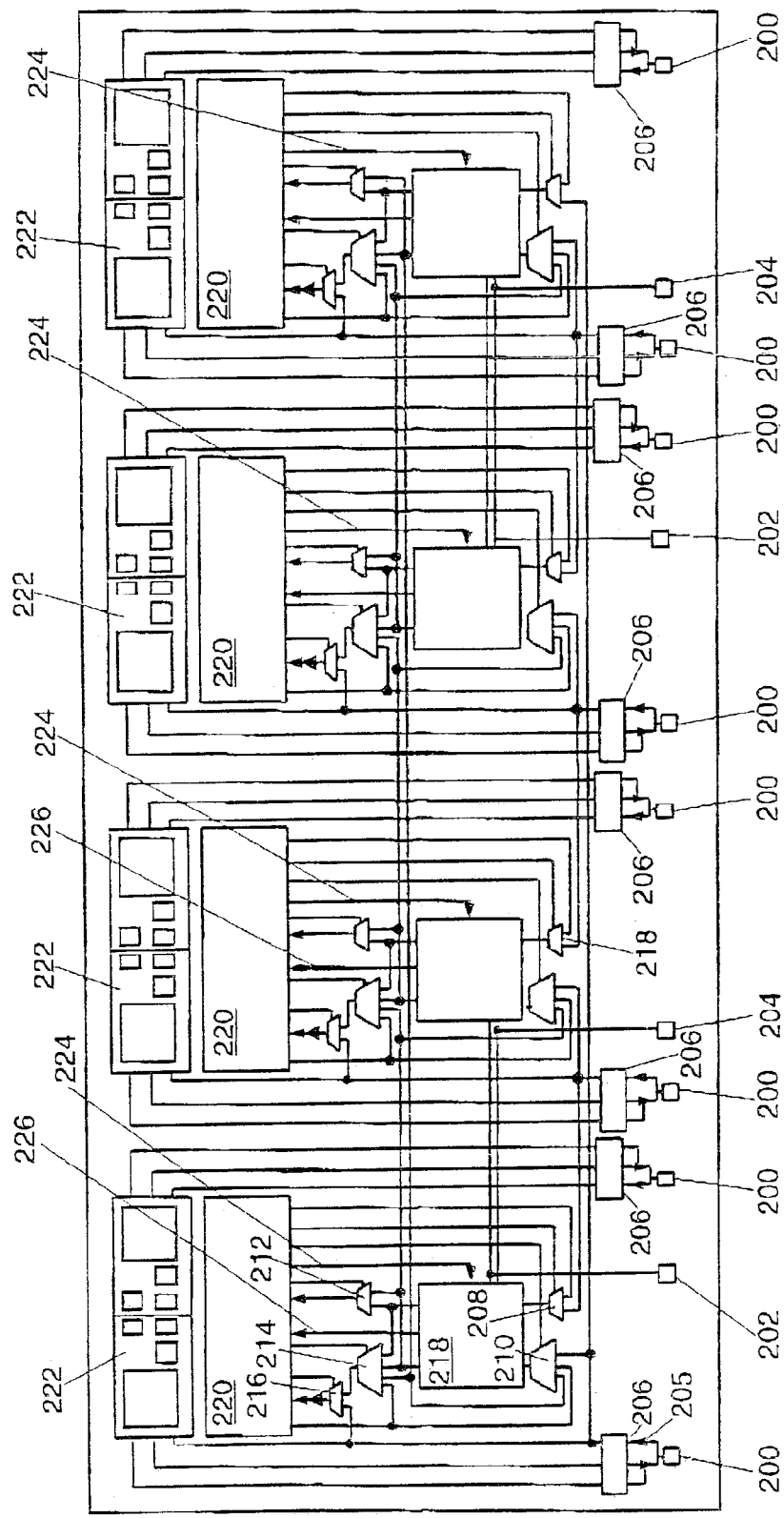
FIG. 5 is a simplified schematic diagram showing the PLL interface with the PLL clusters of the present system.

FIG. 5 is a simplified schematic diagram showing the PLL interface with the PLL clusters of the present system. As illustrated in FIGS. 4 and 5, four PLL cells 218 are located adjacent to each other around the median on the north and south edges of FPGA core tile 100. Each PLL cell 218 is coupled to two I/O pads 200. I/O pad 200 is coupled to PLL cell 218 through a boundary scan register (BSR) 206, output buffer 203 and input buffer 205. The function of the BSR is to test the circuit to determine if it performs as programmed. The testing function, as it relates to the PLL cell 218 and PLL cluster 220 will be discussed in greater detail below.

In addition, I/O pad 200 may be coupled to PLL cell 218 though a plurality of multiplexers. As shown in FIG. 5, for illustrative purposes only, I/O pad is coupled to PLL cell 218 through multiplexers 208 and 210. As those skilled in the art having the benefit of this disclosure will readily realize, any number of multiplexers may be employed or not employed to coupled I/O pads 200 to PLL cell 218. PLL cells 218 are selectively coupled to PLL cluster 220 through multiplexers 212, 214 and 216. As those skilled in the art having the benefit of this disclosure will readily realize, any number of multiplexers may be employed or not employed to coupled PLL cluster 220 to PLL cell 218. Coupling PLL cell 218 to I/O pads 200 and PLL cluster 220 through multiplexers 208, 210, 212, 214 and 216 allows for greater signal selection flexibility. Multiplexers 208, 210, 212, 214 and 216 allow for different input signals to be received through the two input PLL cell 218. Multiplexers 208, 210, 212, 214 and 216 also allow for the routing of output signals from PLL cell 218 to adjacent PLL clusters 220.

Two routing buses connect PLL cell 218 directly to PLL cluster. Routing bus 226 connects an output of PLL cell 218 directly to PLL cluster 220. Routing bus 224 connects an output of PLL cluster 220 directly to PLL cell 218.

The I/O pads 200 attached to a PLL cluster 120 can be configured for regular functions through the inside I/O cluster 104 if they are not required by PLL cluster 120. I/O clusters 104 are beyond the scope of this disclosure and will not be discussed in detail herein. The path to I/O cluster 104 should be gated by control signals to minimize loading on the clock path. I/O pads 200 may also be configured in all modes available to the regular I/O pads in the same I/O bank. In particular, the REFN and REFP pads can be configured into a differential pair.

PLL cells 218 may share a pair of dedicated pads, pad 202 coupled to an analog power supply and pad 204 coupled to ground. Pad 204 is coupled to pad 202 through a decoupling capacitor (not shown) to reduce the jitter of the PLL. PLL cells may also share a common pad that supplies the analog ground (not shown).

Figure 6:
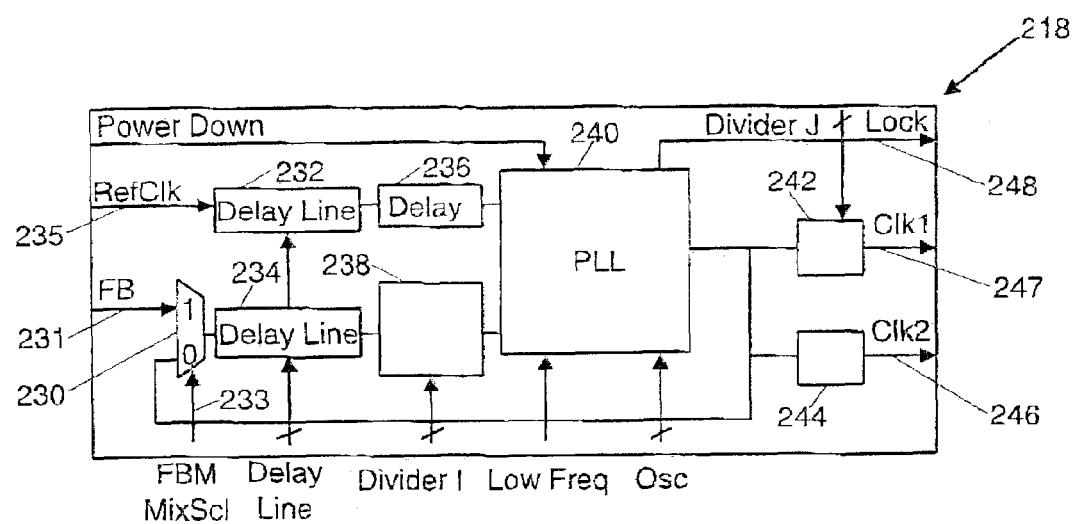
FIG. 6 is a simplified block diagram of a PLL cell.

FIG. 6 is a simplified block diagram of PLL cell 218. PLL cell 218 is comprised of a phased locked-loop (PLL) 240. The first input of PLL 240 receives the reference clock signal from input line 235 through delay line 232. PLL 240 has a second input coupled to an output of two-input multiplexer 234 through a delay line and a divider 1238. The first input of two-input multiplexer 230 receives the feedback port (FB) signal on FB signal line 231. The control input on two-input multiplexer 230 receives the feedback port multiplexer select signal through feedback port multiplexer select signal line 233. The feedback port multiplexer select signal determines whether the source of the feedback path is an internal feedback path or an external feedback path.

PLL 240 has a first output coupled to divider J 242 and delay 244. First output of PLL 240 provides both the clock 1 signal through clock 1 signal output line 247, which is coupled to the first output of PLL 240 though divider J 242, and the clock 2 signal through clock 2 signal output line 246, which is coupled to the first output of PLL 240 through delay circuit 244. The first output of PLL 240 may also be "looped" to the second input of PLL 240 through the second input of two-input multiplexer 230, delay line 234 and divider 1238. PLL 240 has a second output coupled to the lock signal output line 248.

Divider 1238 in the feedback path of the "loop" of PLL 240 is employed for clock signal multiplication. Divider 1238 sets the divide value for the feedback divider. Divider J 242 coupled to the output of PLL 240 is employed for clock signal division. Divider J 242 sets the divide value for the clock 1 divider.

Figure 7:
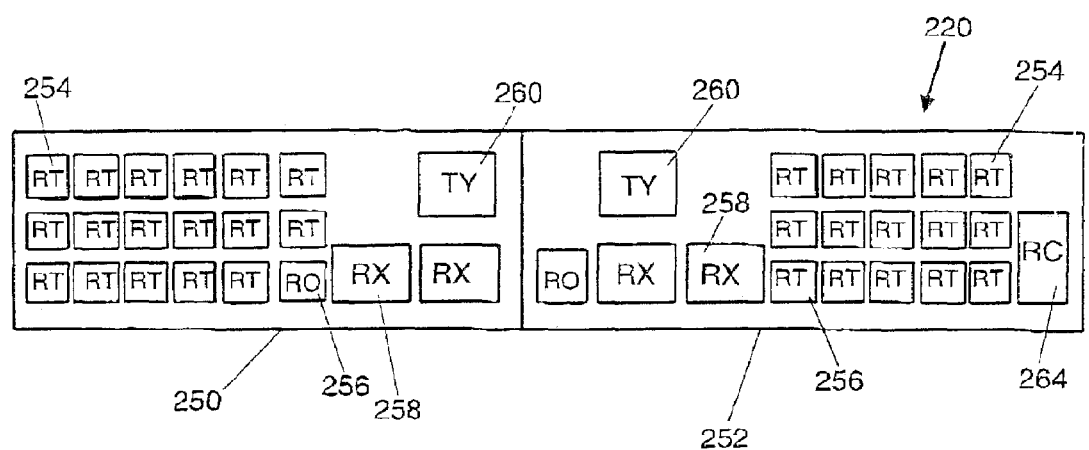
FIG. 7 is a simplified block diagram of a PLL cluster of the present system.

FIG. 7 is a simplified block diagram of a PLL cluster of the present system. PLL cluster 220 is comprised of a left group of modules 250 and a right group of modules 252. According to the present invention, one can use any number of the logic components set forth below. The examples set forth below are for illustrative purposes only and are not meant to limit the present invention.

Left group of modules 250 is comprised of seventeen RT modules 254, an RO module 256, two RX modules 258 and a TY module 260. RX modules 258 receive a clock signal from a long distance. RO modules 256 provide the lock signal and the clock out signal selected between the clock 1 and clock 2 outputs of the PLL cell 218. RC module 264 provides the feedback port signal to PLL cell 218. RT modules configure the various multiplexer select lines or provide control signals to PLL cell 218.

Right group of modules is comprised of fourteen RT modules 254, an RO module 256, two RX modules 258, a TY module 260, a buffer module 262 and an RC module 264. In this example, RT modules 254, RC module 264 and TY module 260 are driver modules and RX modules 258 and RO modules 256 are receiver modules. Table 1 sets forth PLL cluster 220 signal assignments.

TABLE 1

| WEST INPUTS | WEST OUTPUTS | EAST INPUTS | EAST OUTPUTS |
|---|---|---|---|
| RT1: ROOTSEL | RO: LOCK | RC: FBINT | RO: CLKOUT |
| RT2: PLLSEL[0] | | RT1: REFSEL[0] | |
| RT3: PLLSEL[1] | | RT2: REFSEL[1] | |
| RT4: CLKINT | | RT3: FBSEL | |
| RT5: Power Down | | RT4: Delay line[0] | |
| RT6: FBMuxSel | | RT5: Delay line[1] | |
| RT7: Osc[0] | | RT6: Delay line[2] | |
| RT8: Osc[1] | | RT7: Delay line[3] | |
| RT9: Osc[2] | | RT8: Delay line[4] | |
| RT10: LowFreq | | RT9: DividerJ[1] | |
| RT11: DividerI[0] | | RT10: DividerJ[2] | |
| RT12: DividerI[1] | | RT11: DividerJ[3] | |
| RT13: DividerI[2] | | RT12: DividerJ[4] | |
| RT14: DividerI[3] | | RT13: DividerJ[5] | |
| RT15: DividerI[4] | | RT14: DividerJ[6] | |
| RT16: DividerI[5] | | | |
| RT17: OUTSEL | | | |

To avoid overcomplicating the disclosure and thereby obscuring the present invention, RT modules and RO module 256 are not described in detail herein. The implementation of RT modules 254 and RO module 256 suitable for use according to the present system is disclosed in U.S. patent application Ser. No. 10/448,259, filed May 28, 2003, now issued as U.S. Pat. No. 6,383,902, and hereby incorporated herein by reference.

To avoid overcomplicating the disclosure and thereby obscuring the present invention, receiver modules 258, transmitter modules 260 and buffer module 262 are not described in detail herein. The implementation of receiver modules 258 and transmitter modules 260 suitable for use according to the present system is disclosed in U.S. patent application Ser. No. 10/323,613, filed Dec. 18, 2002, now issued as U.S. Pat. No. 6,946,871, and hereby incorporated herein by reference. The implementation of buffer modules 262 suitable for use according to the present system is disclosed in U.S. patent application Ser. No. 10/293,895, filed Nov. 12, 2002, now issued U.S. Pat. No. 6,727,726, and hereby incorporated herein by reference.

Figure 8:
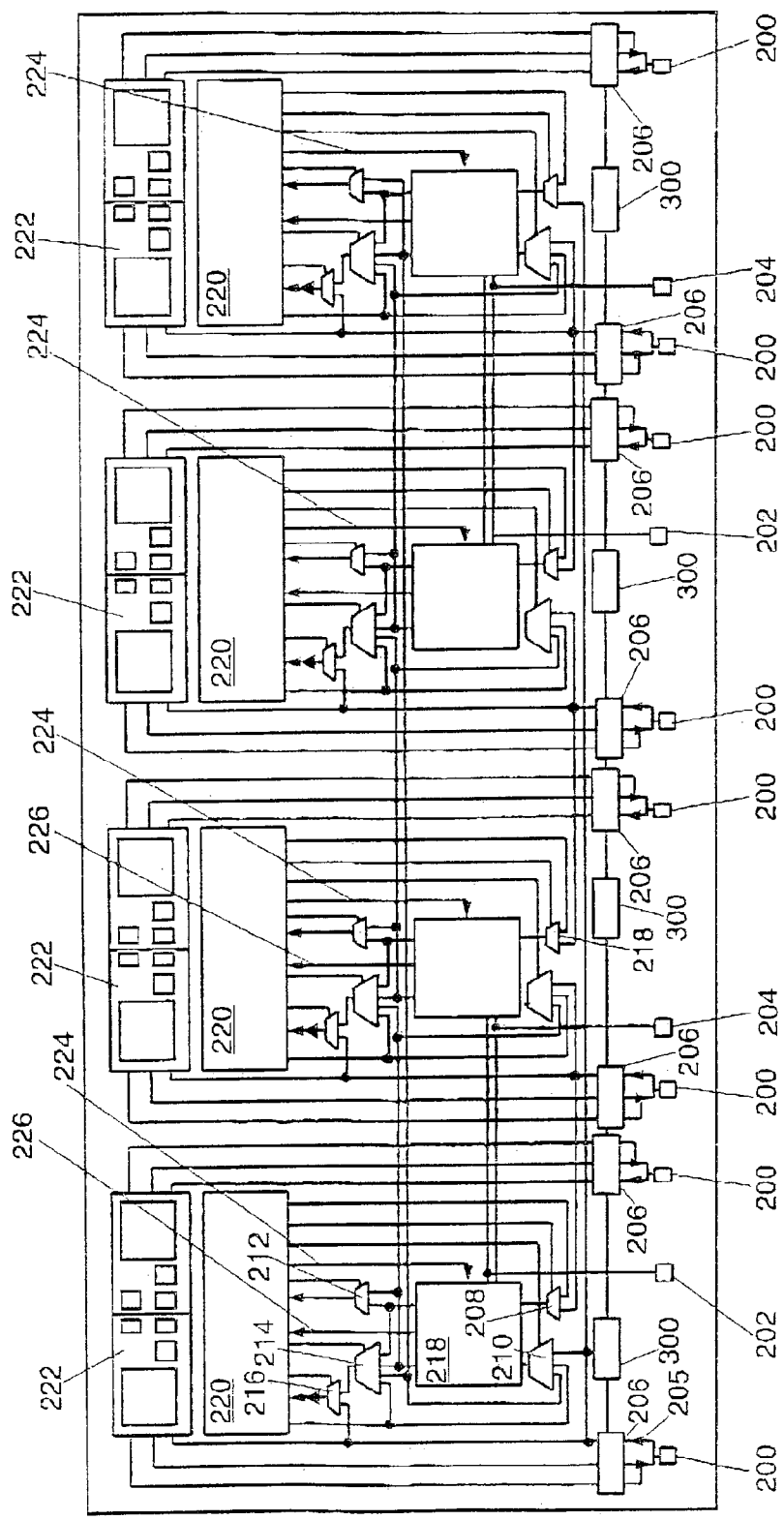
FIG. 8 is a simplified schematic diagram showing the PLL interface including the test registers with the PLL clusters of the present system.

FIG. 8 is a simplified schematic diagram showing the PLL interface including the test registers with the PLL clusters of the present system. While FIG. 8 includes many elements previously discussed in FIG. 5, which will not be discussed again herein, FIG. 8 also includes PLL test register 300. As shown in FIG. 8, the PLL test registers 300 are coupled between boundary scan registers 206.

Figure 9:
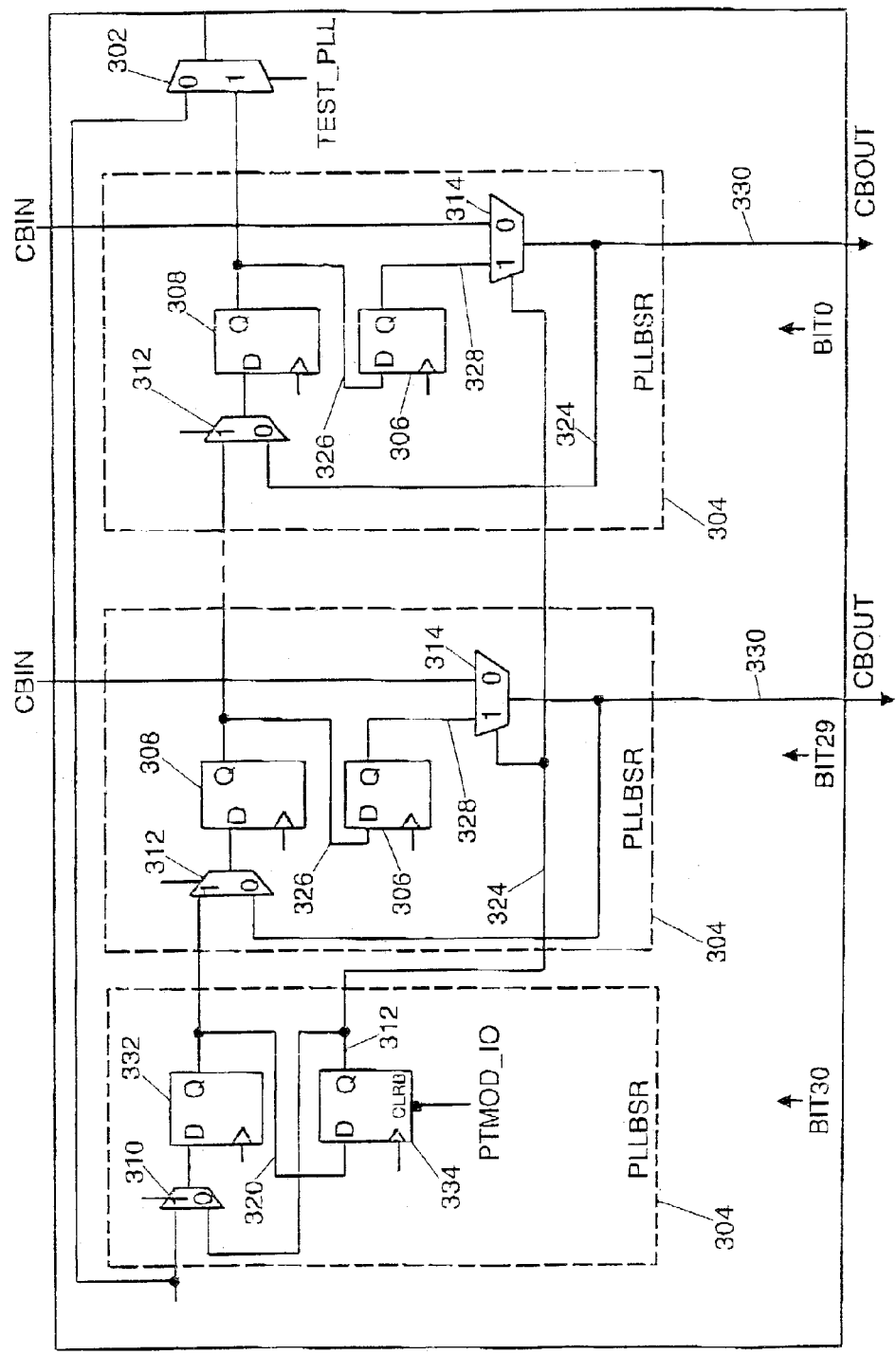
FIG. 9 is a simplified schematic diagram showing the test register circuit path for a PLL cell as disclosed in the present system.

FIG. 9 is a simplified schematic diagram showing the test register circuit path for a PLL cell 218 shown in FIG. 6. A special global control signal (TEST_PLL) is used to enable PLL testing. During PLL cell 218 testing, PLL test register 300 is inserted into the boundary scan register (not shown) at the points where PLL clusters 220 are located. The result is a variable-length boundary scan register chain which is dependent on the control bit (TEST_PLL).

Referring still to FIG. 9, each PLL test register 300 contains 31 PLL boundary scan register bits 304(0)-304(30). Each of PLL boundary scan register bit 304(0)-304(29) comprises two D flip-flops 306 and 308 and two two-input multiplexers 312 and 314. PLL boundary scan register bit 304(30) has only one multiplexer 310 to control multiplexer 314 in boundary scan register bits 304(0)-304(29). Table 2 illustrates PLL test register 300 signal assignments.

TABLE 2

| BIT NUMBER | PLL CONTROL SIGNAL |
|---|---|
| 0 | ROOTSEL |
| 1 | PLLSEL0 |
| 2 | PLLSEL1 |
| 3 | OUTSEL |
| 4 | REFSEL0 |
| 5 | REFSEL1 |
| 6 | FBSEL |
| 7 | PWRDOWN |
| 8 | EXTFBSEL |
| 9 | LOFREQ |
| 10 | OSC0 |
| 11 | OSC1 |
| 12 | OSC2 |
| 13 | DELAYLINE0 |
| 14 | DELAYLINE1 |
| 15 | DELAYLINE2 |
| 16 | DELAYLINE3 |
| 17 | DELAYLINE4 |
| 18 | DIV1DERJ0 |
| 19 | DIVIDERJ1 |
| 20 | DIVIDERJ2 |
| 21 | DIVIDERJ3 |
| 22 | DIVIDERJ4 |
| 23 | DIVIDERJ5 |
| 24 | DIVIDERI0 |
| 25 | DIVIDERI1 |
| 26 | DIVIDERI2 |
| 27 | DIVIDERI3 |
| 28 | DIVIDERI4 |
| 29 | DIVIDERI5 |
| 30 | PLLBSR MUX Control |

PLL boundary scan register bit 304(30) is a special control bit. PLL boundary scan register bit 304(30) controls the output of multiplexers 314 of PLL boundary scan register bit 304(0) through 304(29) to determine whether PLL cell 218 is controlled by PLL cluster 220 or by PLL test register 300. PLL boundary scan register bit 304(30) controls the output of multiplexers 314 of PLL boundary scan register bit 304(0) through 304(29) through the output of multiplexer 310 which is coupled to the control input of multiplexers 314 in PLL boundary scan register bit 304(0) through 304(29) through flip-flop 332 and 334 in PLL boundary scan register bit 304 (30). The output of flip-flop 334 is coupled via routing line 322 to the control input of multiplexers 314. The output of multiplexers 314 is then looped via routing line 324 to the second input of multiplexers 312. The output of multiplexer 314 is also coupled to output CBOUT via routing line 330.

PLL test register 300 may also be used to observe normal PLL cell 318 controls. Observing PLL cells 318 controls is accomplished by loading the data values from the outputs of multiplexers 314 through line 324 and multiplexers 312 into the PLL boundary scan register bits 340(0) through 340(30) and shifting them out through the output of the boundary scan register (BSR) for validation.

Figure 10:
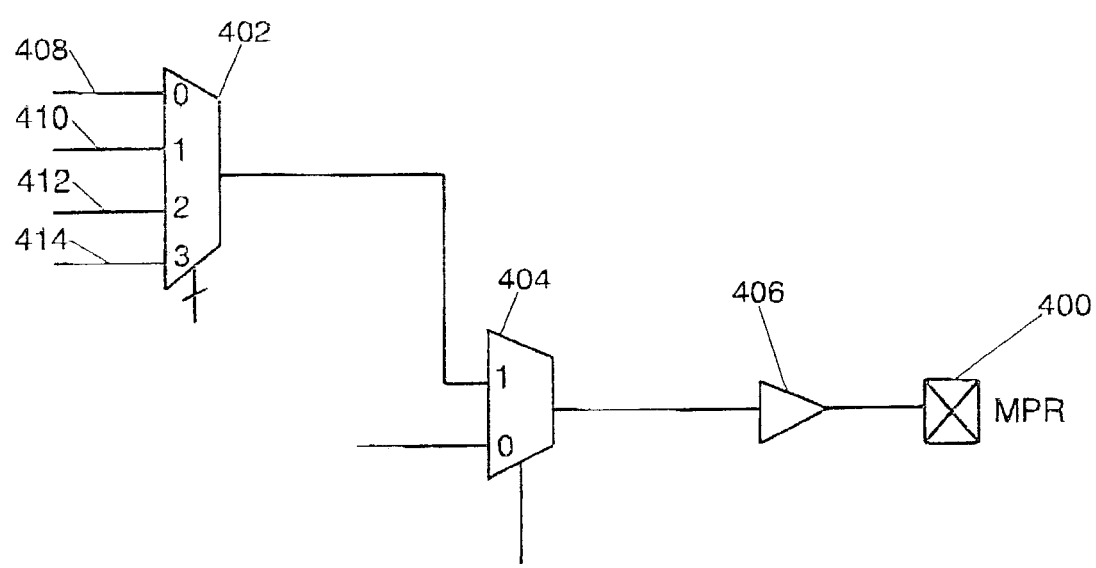
FIG. 10 is a simplified schematic drawing of a microprobe of the test register circuit of FIG. 8 of the present system.

FIG. 10 is a simplified schematic drawing of a microprobe of the present system. The results of PLL cell 318 tests are seen though the output of a plurality of microprobes 400. In the present example, for illustrative purposes only, there are four microprobes 400 located on FPGA core tile 100. Two microprobes 400 on the North edge of FPGA core tile 100 and two microprobes on the South edge of FPGA core tile 100.

Microprobe 400 receives ROOT signals from the four PLL cells 318 on the same edge of FPGA core tile 100 through inputs 408, 410, 412, 414 of multiplexer 402. The output of multiplexer 402 is coupled to a first output of two-input multiplexer 404. The output of multiplexer 404 is coupled to microprobe 400 through buffer 406. As stated previously, the results of the testing of PLL cell 318 are read through microprobe 400.

In an alternate embodiment, microprobe 400 receives signals from the normal probe circuitry. When receiving normal probe circuitry signals, microprobe 400 is configured to observe the LOCK or CLKOUT signal of the PLLs. The frequency of the output signal on microprobes 400 may be limited to approximately 50 MHz by using the frequency divider in the PLLs.

It should be understood that various alternatives to the embodiments of the disclosed method and apparatus descried herein maybe employed in practicing the disclosed method and using the disclosed apparatus. It is intended that the following claims define the scope of the disclosed method and apparatus and that methods and structures within the scope of these claims and their equivalents be covered thereby.

The invention claimed is:

1. An apparatus for interfacing a phase locked loop in a field programmable gate array, said apparatus comprising:
   a phase locked loop cluster comprising:
      a plurality of logic components designed to provide lock signals and clock signals,
      a plurality of logic components that configure and provide control signals,
      at least one driver module,
      a plurality of receiver modules, and
      at least one buffer module; and
   a phase locked loop selectively coupled to an input/output pad and said phase locked loop cluster through a plurality of multiplexers.

2. The apparatus of claim 1 wherein said phase locked loop is selectively coupled to said input/output pad through said phase locked loop cluster and through a plurality of multiplexers.

3. The apparatus of claim 1, wherein said phase locked loop cluster further comprises a feedback module that provides a feedback port signal to said phase locked loop.

4. The apparatus of claim 3, wherein said phase locked loop comprises a first input and a second input, said first input receiving a reference clock signal from an input line through a delay line, and said second input is coupled to an output of a multiplexer through a delay line and a divider.

5. The apparatus of claim 4, wherein said multiplexer receives said feedback port signal.

6. A method of interfacing a phase locked loop between a field programmable gate array core and at least one of a plurality of input/output pads comprising:
   coupling a phase locked loop cell to the field programmable gate array core through a phase locked loop cluster, said phase locked loop cluster comprising a plurality of logic components designed to provide lock signals and clock signals, a plurality of logic components that configure and provide control signals, at least one driver module, a plurality of receiver modules, and at least one buffer module; and
   coupling the at least one of a plurality of input/output pads to the phase locked loop cell,
   wherein said phase locked loop cell is selectively coupled to said at least one of a plurality of input/output pads and said phase locked loop cluster through a plurality of multiplexers.

7. The method of claim 6 wherein the phase locked loop cluster is further coupled to the field programmable gate array core through an input/output cluster.

8. The method of claim 7 wherein the phase locked loop cluster is further coupled to the field programmable gate array core through at least one of a plurality of multiplexers.

9. The method of claim 6, wherein said phase locked loop cluster further comprises a feedback module that provides a feedback port signal to said phase locked loop cell.

10. The method of claim 9, wherein said phase locked loop cell comprises a first input and a second input, said first input receiving a reference clock signal from an input line through a delay line, and said second input is coupled to an output of a multiplexer through a delay line and a divider.

11. The method of claim 10, wherein said multiplexer receives said feedback port signal.

* * * * *